United States Patent [19]

Kobayashi

[11] Patent Number: 5,357,138
[45] Date of Patent: Oct. 18, 1994

[54] COAXIAL WIRING PATTERN STRUCTURE IN A MULTILAYERED WIRING BOARD

[75] Inventor: Yoshinobu Kobayashi, Tokyo, Japan

[73] Assignee: NEC Corporation, Tokyo, Japan

[21] Appl. No.: 838,697

[22] Filed: Feb. 21, 1992

[30] Foreign Application Priority Data

Feb. 22, 1991 [JP] Japan .................. 3-050708

[51] Int. Cl.$^5$ .................. H01L 23/48; H01L 29/40; H03F 3/60; H03B 5/12
[52] U.S. Cl. .................. 257/664; 257/662; 330/286; 330/295; 331/107 C
[58] Field of Search .................. 357/68, 71; 257/664, 257/662; 330/286, 295; 331/107 C

[56] References Cited

U.S. PATENT DOCUMENTS

| | | | |
|---|---|---|---|
| 4,514,749 | 4/1985 | Shoji | 357/68 |
| 4,626,889 | 12/1986 | Yamamoto et al. | 357/71 |
| 4,958,222 | 9/1990 | Takakura et al. | 257/659 |
| 5,111,264 | 5/1992 | Hoshi | 357/30 |
| 5,126,825 | 6/1992 | Harada | 357/71 |

FOREIGN PATENT DOCUMENTS

| | | |
|---|---|---|
| 0178641 | 9/1985 | Japan . |
| 0067941 | 3/1989 | Japan . |
| 2168857 | 6/1986 | United Kingdom ............... 257/659 |

*Primary Examiner*—Andrew J. James
*Assistant Examiner*—Valencia M. Wallace
*Attorney, Agent, or Firm*—Sughrue, Mion, Zinn, Macpeak & Seas

[57] ABSTRACT

In a thick multilayered wiring board, a coaxial signal wiring pattern is surrounded by upper and lower horizontal grounded conductive layers and vertical grounded conductive layers and the vertical conductive layers of conductive layers which surround the coaxial signal wiring pattern are formed in a photosensitive dielectric layer by a photolithography, whereby matching of characteristic impedance of the pattern is improved and thus crosstalk is reduced.

1 Claim, 3 Drawing Sheets

COAXIAL WIRING PATTERN STRUCTURE IN A MULTILAYERED WIRING BOARD

BACKGROUND OF THE INVENTION

1. Field of the Invention

The present invention relates to a coaxial wiring pattern structure and a process for manufacturing the same and in particular to a coaxial signal wiring pattern structure in a thick multilayered wiring board and a process for manufacturing the same.

2. Description of the Related Art

When forming a signal wiring pattern in a thick multilayered wiring board, matching of the characteristic impedance of the signal wiring pattern with that of a semiconductor device and reduction in crosstalk noise has heretofore been performed in order to enhance the signal propagation characteristics of the signal wiring pattern. A strip line structure has been generally adopted as a signal wiring pattern. The strip line structure comprises a substrate 6, a signal wiring pattern 1, a dielectric 3 and a conductor 5 or 4 as shown in FIGS. 1 and 2. In FIG. 1, the signal wiring pattern 1 is formed on the substrate 6, the dielectric 3 is formed on the substrate 6 covering the pattern 1 and an upper conductor 5 which functions as a power supply wiring layer or a grounded layer is formed above the pattern 1. In FIG. 2, the signal wiring pattern 1 is formed on the dielectric 3 and above the substrate 6, a lower conductor 4 having the above-mentioned function is formed below the pattern 1 and on the substrate 6, and the dielectric 3 is formed on the lower conductor 4; whereby the characteristic impedances are matched. Alternatively, the strip line structure comprises a signal wiring pattern 1 and upper and lower conductors 5 and 4 which function as a power supply wiring layer or a grounded layer and which are disposed above and below the signal wiring pattern 1, respectively, so that the signal wiring pattern 1 is interposed therebetween as shown in FIG. 3, if the frequency of the signal transmitting through the pattern 1 falls in a several hundred MHz band.

Since the crosstalk noise is caused by an influence of static capacity between a signal wiring and its upper and lower conductive layers or between the signal wiring and the adjacent signal wiring, the spacing between the signal wirings is widened, the film thickness of the signal wiring is made thinner and the line width of the wiring is reduced to decrease the coupling capacity. For the signal wiring pattern in which the frequency of signal exceeds several hundred MHz or the signal potential of the neiboring signal wiring is high, the upper and lower conductive layers are disposed above and below the signal wiring, respectively, and grounded wirings 7 are disposed between the signal wirings as shown in FIG. 3.

However, the above mentioned prior art technique can not satisfactorily surround the signal wiring pattern. In a frequency band exceeding several hundred MHz, therefore, an electrical signal leaks from the signal wiring pattern and crosstalk noise is generated due to influence between adjacent wiring patterns. Also, mismatching of the characteristic impedance occurs.

The wiring patterns are generally formed by a screen printing method. In case of a wiring pattern having a wiring width of about 100 μm, 325 mesh stainless screens are widely used. In this case, however, it is difficult to provide a wiring having a printed film thickness which is not higher than 10 μm. In a high density packaging, the pitch among the wirings is narrow so that crosstalk noise will become serious. In a frequency band exceeding several hundred MHz, low dimensional precision of the signal wiring pattern will cause mismatching of the characteristic impedances so that abnormal propagation of the signal may occur.

Moreover, Japanese Patent Application Public Disclosure No. 84053/1988 discloses a coaxial wiring structure which comprises a first substrate having a first conductor on the inside wall of a groove formed in its surface and a second conductor disposed on the surface of a dielectric filled within the groove and a second substrate having a third conductor on the inside wall of a groove formed in its surface. The second substrate is integrally superposed on the first substrate to construct a coaxial wiring with the first and third conductors as an exterior conductor and the second conductor as an interior conductor. In this prior art, the exterior conductors and the dielectric are formed within the groove which is formed in the surface of the substrate.

SUMMARY OF THE INVENTION

It is an object of the present invention to provide a coaxial wiring pattern structure in which matching of the characteristic impedance is improved and crosstalk is reduced and a process for manufacturing the same.

In order to accomplish the above mentioned object of the present invention, there is provided a coaxial wiring pattern structure, comprising a wiring pattern; a dielectric layer; and a grounded conductive layer, said grounded conductive layer and said dielectric layer being disposed on a substrate, said wiring pattern being surrounded with said dielectric layer which is succeedingly surrounded with said grounded conductive layer.

Further, the foregoing object of the present invention can effectively be achieved by providing a process for forming a coaxial wiring pattern structure, comprising the steps of forming a lower conductive layer on a substrate; forming a lower photosensitive dielectric layer on the lower conductive layer; forming grooves through the lower photosensitive dielectric layer to the lower conductive layer; filling the grooves with a conductor to form lower vertical conductive layers in the dielectric layer; forming a wiring pattern on the lower dielectric layer; forming an upper photosensitive dielectric layer on the lower dielectric layer and the wiring pattern; forming grooves through the upper photosensitive dielectric layer to the lower vertical conductive layers; filling the grooves with a conductor to form upper vertical conductive layers on the lower vertical conductive layers, respectively; and forming an upper conductive layer on the upper dielectric layer and upper vertical conductive layers.

In accordance with the present invention, the coaxial wiring pattern structure is formed by surrounding the wiring pattern with the grounded vertical conductive layers which are located at the sides of the pattern and the grounded upper and lower conductive layers. The grounded vertical layers are formed by using a photosensitive dielectric material.

BRIEF DESCRIPTION OF THE DRAWINGS

The aforementioned and other objects, features and advantages of the present invention will become more apparent from the following description taken with reference to the accompanying drawings, werehin

DESCRIPTION OF PREFERRED EMBODIMENT

Figure 1:
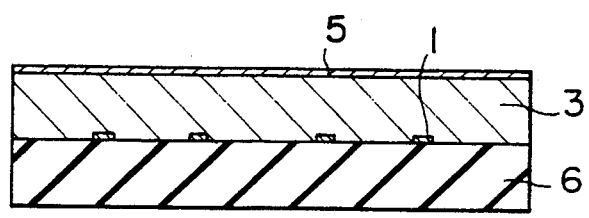
FIG. 1 is a sectional view showing a prior art coaxial wiring pattern structure.
Figure 2:
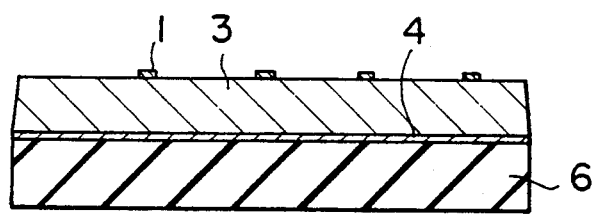
FIG. 2 is a sectional view showing another prior art coaxial wiring pattern structure.
Figure 3:
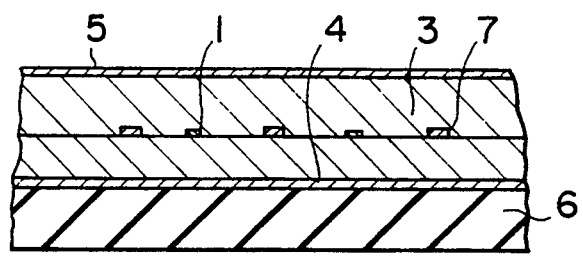
FIG. 3 is a sectional view showing a further another prior art coaxial wiring pattern structure.
Figure 4:
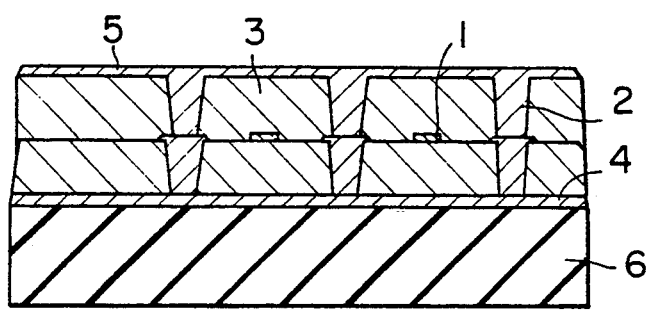
FIG. 4 is a sectional view showing an embodiment of the coaxial wiring pattern structure according to the present invention.
Figure 5:
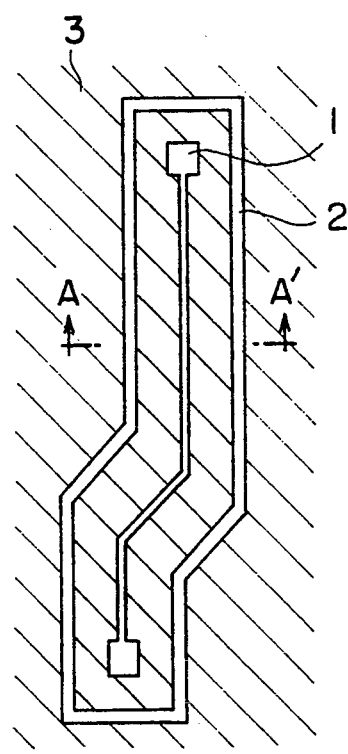
FIG. 5 is a schematic view illustrating a process for manufacturing the coaxial wiring pattern structure of the present invention.
Figure 6:
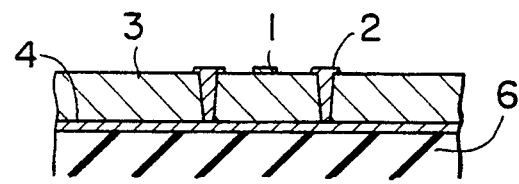
FIG. 6 is a sectional view taken along the line A—A' in FIG. 5.
Figure 7:
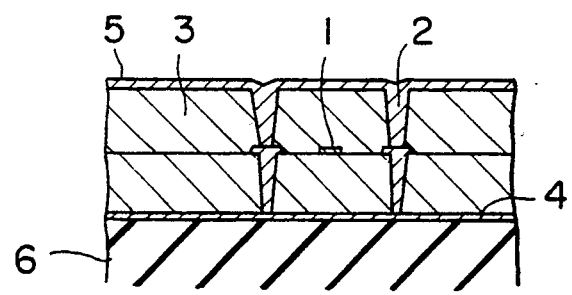
FIG. 7 is a sectional view illustrating a process for manufacturing the coaxial wiring pattern structure of the present invention.

The coaxial wiring pattern structure according to the present invention will be described in more detail with reference to the accompanying drawings. FIG. 4 is a sectional view showing the structure of an embodiment of the coaxial wiring pattern structure of the present invention and FIGS. 5 to 7 are views illustrating a process for manufacturing the coaxial wiring pattern structure of the present invention.

First referring to FIG. 4, the embodiment of the coaxial wiring pattern structure has a substrate 6, a lower conductor 4, side conductors 2, a dielectric layer 3, a signal wiring pattern 1 and an upper conductor 5. The signal wiring pattern 1 formed above the substrate 6 is surrounded by the dielectric layer 3 which is followed by the lower conductor 4, the side conductors 2 and the upper conductor 5. The upper conductor 5, the lower conductor 4 and the side conductors 2 are grounded (not shown). The signal wiring pattern 1 has a coaxial wiring structure in this condition. The characteristic impedance of the signal wiring pattern 1 depends on the permeability of the dielectric layer 3, the line width and the film thickness of the signal wiring pattern 1, and the distance between the pattern 1 and the surrounding grounded conductive layer.

Now, a process for manufacturing a coaxial wiring pattern structure will be described. Referring to FIGS. 5 and 6, a substrate 6 is preliminarily washed with an organic solvent or hydrochloric acid and the like on the pattern forming surface thereof. A lower conductor 4 is formed on the substrate 6 by a thick film printing method or a thin film forming method.

Thereafter, a photosensitive dielectric material is applied on the lower conductor 4 by a thick film printing method. After a layer of the applied dielectric material has been dried, grooves are formed through the dielectric layer to the lower conductor 4 by a photolithographic process. A thick film forming conductor paste is charged into the grooves, and is then baked to form side conductors 2 and a dielectric layer 3 above the substrate 6.

Then, a signal wiring pattern 1 is formed on the dielectric layer 3 by the thick film printing method or the thin film forming method.

In the embodiment of the present invention, the substrate 6 is composed of 96% alumina ceramics and the lower conductor 4 and the side conductors 2 are composed of a thick film forming conductor paste of gold. After printing and drying, the conductors are baked at a temperature of about 900° C. The dielectric layer 3 is composed of a photosensitive dielectric material, such as polyamide or the like, having the negative type photosensitive characteristics. The layer is irradiated with ultraviolet rays, is treated with trichloroethane for development and then is baked at a temperature of about 900° C. The signal wiring pattern 1 is formed by a thin film plating method in which gold is used. Since high dimensional precision of the signal wiring pattern is achieved by the thin film plating method, impedance matching is excellent.

Referring to FIG. 7, an upper dielectric layer is then formed by applying a photosensitive dielectric material on the above lower dielectric layer by the thick film printing method. The upper dielectric layer is treated similarly to the above mentioned lower dielectric layer. Finally, an upper conductor 5 is formed by the thick film printing method using a thick film forming gold paste.

According to the present invention, the side conductors 2 are made in the form of a partition or enclosure so as to separate the signal wiring pattern from the adjacent signal wiring pattern, whereby interference between the signal wiring pattern 1 and the adjacent conductors is suppressed to reduce crosstalk noise in comparison to the prior art.

As has been explained above in detail, according to the present invention, a coaxial wiring structure is formed by surrounding or enclosing a signal wiring pattern with grounded conductive layers, whereby a wiring pattern which has an excellent matching of the characteristic impedance and less interference with the adjacent conductor can be provided.

What is claimed is:
1. A coaxial wiring pattern structure, comprising:
   a substrate;
   a grounded lower conductive layer formed on said substrate;
   a lower dielectric layer selectively formed on said lower conductive layer, said lower dielectric layer comprising lower dielectric portions disposed on said lower conductive layer so as to define spaces therebetween;
   a signal wiring pattern selectively formed on said lower dielectric layer;
   an upper dielectric layer formed of a photosensitive dielectric material on said signal wiring pattern and said lower dielectric layer so as to cover said signal wiring pattern provided on said lower dielectric layer, said upper dielectric layer comprising upper dielectric portions disposed on respective ones of said lower dielectric portions;
   a grounded upper conductive layer formed on said upper dielectric layer;
   grounded conductive layers extending between said upper and lower conductive layers, said grounded conductive layers being disposed in said spaces.

* * * * *